United States Patent
Lee et al.

[11] Patent Number: 5,989,784
[45] Date of Patent: Nov. 23, 1999

[54] ETCH RECIPE FOR EMBEDDED DRAM PASSIVATION WITH ETCH STOPPING LAYER SCHEME

[75] Inventors: Yu-Hua Lee, Hsinchu; Cheng-Ming Wu, Kaoshiung; Chao-Cheng Chen, Tainan, all of Taiwan

[73] Assignee: Taiwan Semiconductor Manufacturing Company, Ltd., Hsin-Chu, Taiwan

[21] Appl. No.: 09/055,463

[22] Filed: Apr. 6, 1998

[51] Int. Cl.[6] .................. G03F 7/40; B44C 1/22; C25F 3/00; C03C 15/00
[52] U.S. Cl. .................. 430/316; 430/317; 216/6; 216/41; 216/67; 216/72; 438/714; 438/738
[58] Field of Search .................. 430/316, 317; 216/41, 6, 67, 72; 438/714, 738

[56] References Cited

U.S. PATENT DOCUMENTS

| | | | |
|---|---|---|---|
| 4,997,789 | 3/1991 | Keller et al. | 437/192 |
| 5,256,597 | 10/1993 | Gambino | 437/189 |
| 5,292,677 | 3/1994 | Dennison | 437/52 |
| 5,536,678 | 7/1996 | Peek | 437/187 |

Primary Examiner—Richard L. Schilling
Attorney, Agent, or Firm—George O. Saile; Stephen B. Ackerman; William J. Stoffel

[57] ABSTRACT

A method of forming an etch stop layer 40 above a fuse 16 in a fuse opening (or window) 92 using a specialized 2 stage etch process. The invention has two important features: First, the etch stop layer 40 is formed from a polysilicon layer (P2 or P4) that is used to fabricate semiconductor devices on a substrate. The etch stop layer 40 is preferably formed of polysilicon layer to is used to from a contact to the substrate 10 (P2) or to form part of a capacitor (P4). Second, a specialized two stage etch process is used where the second stage etches the etch stop layer 40 while simultaneously forming a passivation layer 114 over a metal pad 85. The method comprises: forming fuses 16 over said isolation regions 10 over the fuse area 15; forming a first dielectric layer 30 overlying the fuses 16; forming an etch stop layer 40 over the first dielectric layer 30; forming an insulating layer 43 over the etch stop layer; forming a fuse opening 92 in the insulating layer 43 by etching, in a first etch stage, thorough fuse photoresist openings 90A and stopping the first etch stage on the etch stop layer 40; and etching though the etch stop layer 40 in the fuse opening 92 in a second etch stage.

24 Claims, 4 Drawing Sheets

ETCH RECIPE FOR EMBEDDED DRAM PASSIVATION WITH ETCH STOPPING LAYER SCHEME

BACKGROUND OF INVENTION

1. Field of the Invention

This invention relates generally to the fabrication of etch stops for openings through dielectric layers over fuses for semiconductor devices and more particularly to the uses of an etch stop layer over fuses and a specialized etch process that forms a fuse opening without etch an exposed metal pad.

2. Description of the Prior Art

Fuses can be used to rewire memory and logic circuits. For example, in dynamic or static memory chips, defective memory cells may be replaced by blowing fuses associated with the defective cells, and activating a spare row or column of cells. This circuit rewiring using fusible links allows considerable enhanced yields and reduces the production costs. Also, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible. There are two methods for blowing fuses: (a) using a laser and (b) passing a high current through the fuse. The portion of the fuse and thin insulating layer which is melted away or "blown" must not deposit or interfere with near-by devices. A laser is often used to break the fuse forming an electrical open by heating the fuse to a high temperature. It is conventional to have an opening through insulating layers over the fuse in the area where the fuse will be broken.

The inventor has found major problems the process of forming opening over fuses. As the number of metal layers and inter metal dielectric (IMD) layers increases, it is more difficult to accurately etch a fuse opening to a precise depth. This etch variability changes the thickness of dielectric layer overlying the fuse. The varying dielectric layer thickness over the fuse reduces the laser fuse cutting rate and yields. Moreover, the additional inter metal dielectric layers, the dielectric layer uniformity within wafer and wafer to wafer create difficulty in accurately etching fuse openings.

The importance of overcoming the various deficiencies noted above is evidenced by the extensive technological development directed to the subject, as documented by the relevant patent and technical literature. The closest and apparently more relevant technical developments in the patent literature can be gleaned by considering: U.S. Pat. No. 5,292,677 (Dennison) that teaches a reduced mask CMOS process for fabricating stacked capacitor multi-megabit dynamic random access memories utilizing single etch stop layer for contacts. An etch stop layer is deposited on a DRAM wafer after formation of the PMOS and NMOS transistors. U.S. Pat. No. 4,997,789 (Keller) shows an etch stop for a contact plug process. U.S. Pat. No. 5,256,597 (Gambino) shows an etch stop for an interconnect patterning. U.S. Pat. No. 5,536,678 (Peek) shows another etch stop configuration.

However, there still exists a need for an improved etch process with etch stops to form fuse windows through dielectric layers.

SUMMARY OF THE INVENTION

It is an object of the present invention to provide a method for fabricating a fuse opening through inter metal dielectric layers (IMD) that leaves a precise thickness of dielectric layer overlying the fuse.

It is an object of the present invention to provide a method for forming a fuse opening through dielectric layer using a etch stop layer formed from a polysilicon layer used to formed FET devices in active areas.

It is an object of the present invention to provide a specialized 2 stage etch process for etching forming a fuse opening 92 through dielectric layers using an etch stop layer 40 formed from a polysilicon layer used to formed FET devices in active areas and forming a pad opening 90B over a metal pad 85.

It is another object of the present invention to provide a specialized 2 stage etch process for etching forming a fuse opening 92 through dielectric layers using an etch stop layer 40 that forms a passivation layer 114 over a metal pad 85.

The invention provides a method of forming an etch stop layer 40 above a fuse 16 in a fuse opening (or window) 92 using a specialized etch process. The invention has two important features. (See FIG. 1B). First, the etch stop layer 40 is formed from a polysilicon layer (P2 or P4) that is used to in others areas of the chip to fabricate semiconductor devices. The etch stop layer 40 is preferably formed of the polysilicon layer to is used to from a contact to the substrate 10 (P2) or to form part of a capacitor (P4) (e.g., top electrode 40B). See FIG. 1B. Second, a specialized two stage etch process (total 3 etch steps) where the second stage 112 etches (e.g., $SF_6$ /$Cl_2$) the etch stop layer 40 while simultaneously forming a passivation layer 114 over a metal pad 85 (e.g., Al). See FIG. 3.

In more detail, the invention provides a method of forming a fuse opening 92 using an etch stop layer 40 and a pad opening 94 and a specialized two stage etch process (1a) See FIG. 1—forming isolation regions 10 defining a fuse area and active areas on a substrate 10;

(1b) forming fuses 16 over said isolation regions 10 over said fuse area;

(1c) forming a first dielectric layer 30 overlying said fuses;

(1d) forming an etch stop layer 40 over said first dielectric layer 30;

(1e) forming an first insulating layer 44 over said etch stop layer 16;

(1f) forming a plurality of metal layers 50, 50A, 60, 60A, 70, 70A, 80 spaced apart by a plurality of inter metal dielectric layers 54 64 74 over said insulating layer 40; said plurality of metal layers 50 60 70 80 having a top metal layer 80 and a metal pad 85 formed from said top metal layer;

(1g) forming a top passivation layer 84 over said top metal layer 80 and said insulating layer;

(1h) forming a first photoresist layer 90 having fuse photoresist openings 90A over said fuse area 15 and a photoresist pad opening 90B over said metal pad 85 84;

(1i) etching, in a first etch stage, a fuse opening 92 thorough said fuse photoresist openings 90A in said top passivation layer, said plurality of inter metal dielectric layers 54 64 74, and said insulating layer 44; and etching a pad opening 94 in said top passivation layer 84 exposing said metal pad 85;

(1j) etching, in a second etch stage, though said etch stop layer in said fuse opening 92 and forming a passivation layer 114 over said metal pad.

The invention's Two stage etch process is summarized in the table below:

| STAGE | STEP | ETCH PARAMETERS |
|---|---|---|
| 1 -- IMD etch | 1 | 10 $SF_6$/60$CHF_3$/20$CF_4$//100AR/1100Watts |
|  | 2 | 0 $SF_6$/90 CHF3/20CF4//100AR/1100Watts |
| 2-Etchstop etch | 3 | 10 $SF_6$/0 CHF3/0 $CF_4$/75$Cl_2$/100AR/300Watts |
|  | 3' | 30 $SF_6$/90 CHF3/20$CF_4$/100AR/300Watts |

The invention provides the following features and benefits.

| Feature | Advantage |
|---|---|
| Polysilicon etch stop 40 formed from the second polysilicon layer (P2) 40A or the forth polysilicon layer (P4) 40B See FIG. 1B. | leaves a precise thickness 17 of first dielectric layer 30 is left over the fuses 16 after the etch - FIG. 1A. no etch damage to fuses. |
| Etch process - step 2 - using $SF_6$/$CF_3$/$CF_4$/Ar | high selectivity of oxide to polysilicon |
| Etch process - step 3 with final etch stop etch using $SF_6$ | forms a passivation layer over the metal pad 85 protecting the metal pad form etch defects |
| single photo step to form both fuse opening 92 and pad opening 94 | less expensive process and less complex |

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1A:
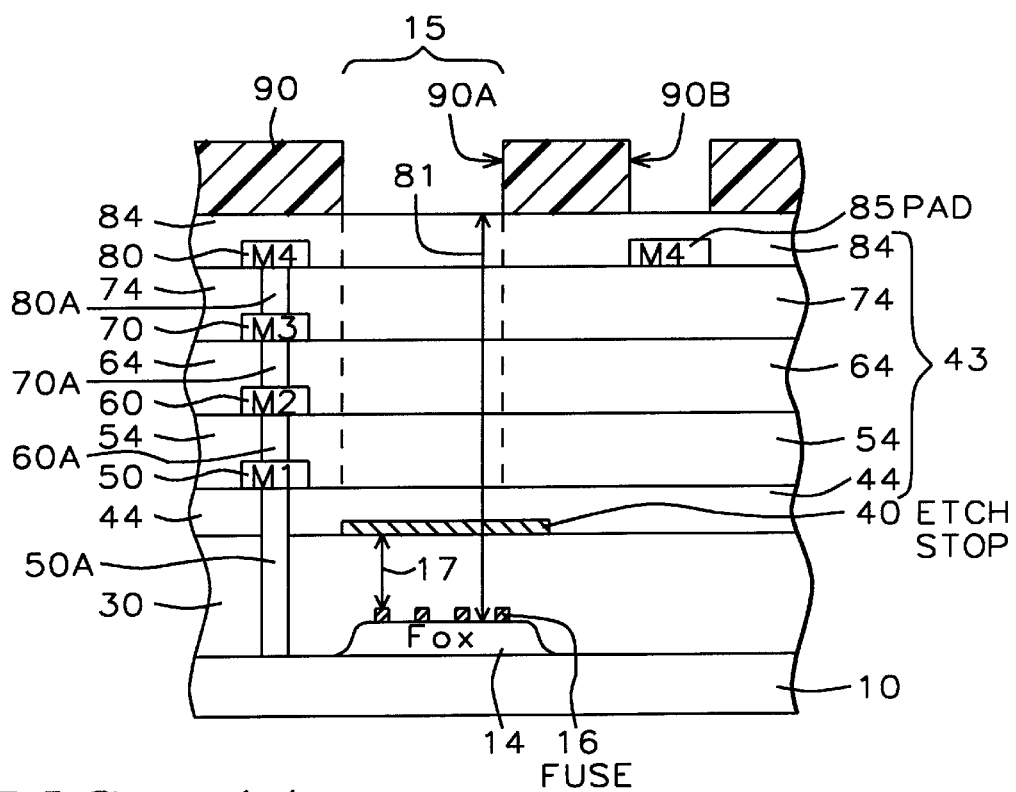
FIGS. 1A, 2 and 3 are cross sectional views for illustrating a method for forming a fuse opening using an etch stop layer 40 according to the present invention.

The present invention will be described in detail with reference to the accompanying drawings. The present invention provides a method of forming an etch stop layer 40 above a fuse 16 in a fuse opening (or window) 92 using a specialized 2 stage etch process. The invention has two important features:

① The etch stop layer 40 is formed from a polysilicon layer that is used to fabricate semiconductor devices over other areas of the chip. The etch stop layer 40 is preferably formed on a polysilicon layer to is used to from a contact to the substrate 10 (P2) or to form part of a capacitor (P4) (e.g., top Electrodes).

② The invention uses a two stage etch process—where the second stage etches (e.g., $SF_6$ /$Cl_2$) the etch stop layer 40 while simultaneously forming a passivation layer 114 over a metal pad 85 (e.g., Al).

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known processes have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc., copyright 1997. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

FIG. 1 shows the forming of isolation regions 10 defining a fuse area 15 and active areas on a substrate 10. Active areas are locations over the substrate without isolation regions 10 where devices are formed. Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

Figure 1B:
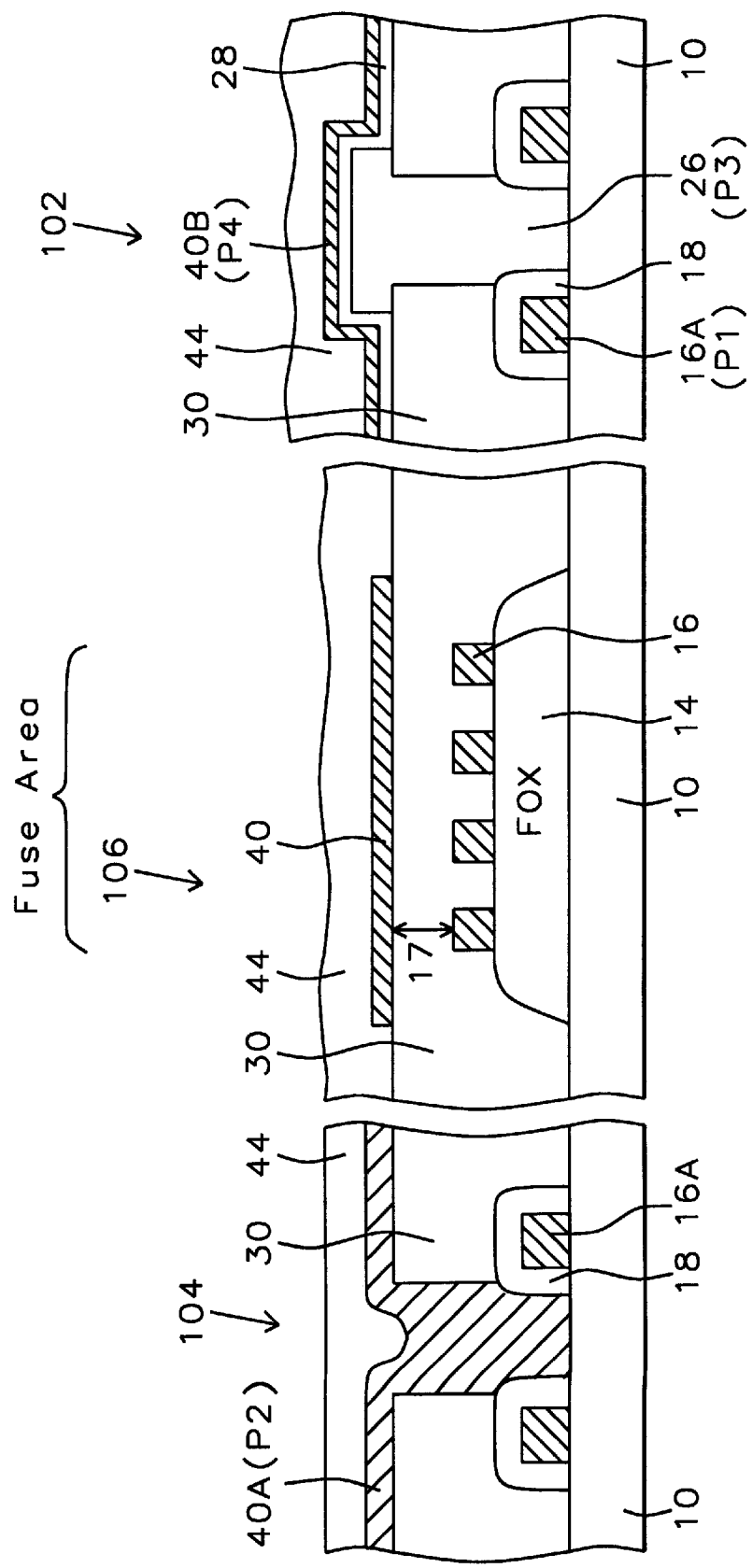
FIG. 1B shows two preferred embodiments of the invention. The center cross section 106 shows fuse area 15 and other overlying layers (e.g., 10, 14, 16, (P1), 30). The section 104 on the left shows an embodiment where the etch stop layer 40 is composed of a second polysilicon layer (P2) 40a that is used to form contacts to the substrate 10. Section 102 shows another embodiment where the etch stop layer 40 is formed of a fourth polysilicon layer (p4) 40B that is used to form the top plate of a capacitor.
Figure 2:
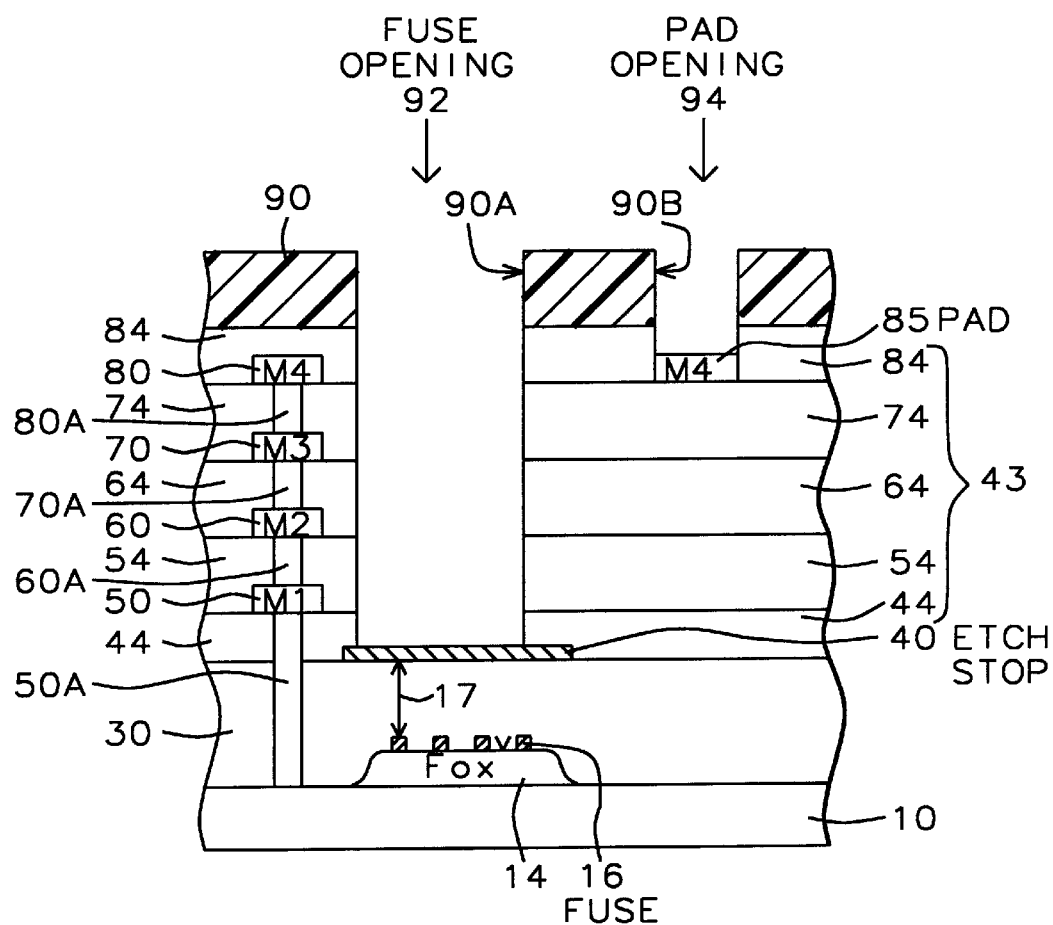

FIG. 1 shows fuses 16 are formed over the isolation regions 14 over the fuse area 15 on a semiconductor substrate 10. The fuses 16 are preferably composed of polysilicon, metal or metal alloys and most preferably are compose of polysilicon. The fuse preferably have a thickness in a range of between about 500 and 3000 Å. The fuses are preferably formed of a first polysilicon layer (P1) that is also used to form gates 16A and wordlines as shown in FIG. 1B.

A first dielectric layer 30 is formed overlying the fuses. The first dielectric layer 30 preferably has a thickness in a range of between about 1000 and 8000 Å (tgt=300 Å).

Next, an etch stop layer 40 is formed over the first dielectric layer 30. The etch stop layer 40 can be composed of polysilicon or a silicide such as $WSi_x$, and more is preferably composed of polysilicon. The etch stop layer preferably has a thickness in a range of between about 500 and 3000 Å.

FIG. 1B shows two preferred embodiments of the invention. The center cross section 106 shows the layers discussed above (e.g., 10, 14, 16, (P1), 30). The section 104 on the left shows an embodiment where the etch stop layer is composed of a second polysilicon layer (P2) 40a that is used to form contacts to the substrate 10 in an active area.

Section 102 on the right of FIG. 1B shows another embodiment where the etch stop layer 40 is formed of a fourth polysilicon layer (p4) 40B that is used to form the top plate of a capacitor. Section 102 shows a bottom plate electrode 26 (P3) formed of a third polysilicon layer (P3), a capacitor dielectric layer 28 and a top plate 40B (P4) formed of the fourth polysilicon layer. The first, second, third and fourth polysilicon layers can be formed of a combination of polysilicon or polycide. It is possible to form the etch stop from other layers as the structure of semiconductor devices evolve over time.

FIG. 1A shows a first insulating layer 44 formed over the etch stop layer 40. The first insulating layer 44 is preferably composed of an oxide or a doped oxide and preferably has a thickness in a range of between about 3000 and 10,000 Å.

Next, a plurality of metal layers (e.g., 50 50A 60 60A 70 70A 80) separated by a plurality of inter metal dielectric layers (e.g., 54 64 74) are formed over the first insulating layer 44. The plurality of metal layers 50 50A 60 60A 70 70A 80 have a top metal layer 80. The top metal layer also forms a metal pad 85 as shown in FIG. 1A.

The metal layers are preferably composed of Ti, TiN and/or AlCu alloys and most preferably composed of aluminum (Al) alloys; and the metal layers preferably have a thickness in a range of between about 3000 and 8000 Å. The metal layers (e.g., 50 50A 60 60A 70 70A 80) can be made up of more than one metal layer. The metal layers can represent metal wiring layers connected together by plug processes (e.g., 50A 60A 70A). Alternately, the metal layers can be formed by borderless or damascene processes using one metal layer or a multi-layer structure including barrier layers, glue layers, etc. (e.g., 60 and 60A are one metal layer in a damascene structure. Layer 50A represents a contact the substrate or can be an indirect contact through other underlying layers (not shown). The metal layers can be formed by technologies and processes commonly known in the semiconductor industry.

The plurality of inter metal dielectric (IMD) layers 54 64 74 is preferably composed of oxide, oxide formed using a PETEOS process, oxide formed using a sub atmospheric chemical vapor deposition (SACVD) oxide process or oxide formed using a Plasma enhanced process, and most preferably oxide formed using a PETEOS process. The IMD layers preferably have a thickness in a range of between about 5000 and 20,000 Å. The IMD layers 54 65 74 preferably have a total thickness 81 in a range of between about 6 and 7 $\mu$m.

It will be appreciated by those skilled in the art that the exact processes used to form the metal layers, inter level dielectrics/inter metal dielectric layers, vias, interconnects can be varied using known processes and materials without substantially effecting the invention.

A top passivation layer 84 is formed over the top metal layer 80. The top passivation layer 84 is preferably composed of PE-SiN (Silicon nitride formed using plasma enhanced process), spin-on-glass (SOG) or oxide formed by a plasma enhanced process, and most preferably composed of PE-SIN, and has a thickness in a range of between about 10,000 and 20,000 Å.

A first photoresist layer 90 having fuse photoresist openings 90A over the fuse area 15 and an photoresist pad opening 90B is formed over a metal pad 85 preferably comprised of Aluminum formed from the top metal layer (E.g., 84).

The preferred etch process of the invention has two stages: ① etching through the inter metal dielectric layers 54 64 75 84 over the etch stop layer 40 in the fuse area and forming a pad opening 94 over the pad 85; and ② etching through the etch stop layer 40 and passivating the metal pad 85.

The etch process can be summarized as shown below:

TABLE

Summary Of Etch For Fuse Opening 92 Using A Polysilicon Etch Stop Layer 40

| STAGE | STEP | ETCH PARAMETERS | COMMENTS |
|---|---|---|---|
| 1 -- IMD etch | 1 | 10 $SF_6$/60CHF$_3$/20CF4//100AR/ 1100Watts | etch recipe with good uniformity |
|  | 2 | 0 $SF_6$/90 CHF3/20$CF_4$//100AR/ 1100Watts | high selectivity to poly by uniformity is less than step 1 |
| 2 - Etch stop etch | 3 | 10 $SF_6$/0 CHF3/ 0 $_{CF4}$/75$Cl_2$/100AR/ 300Watts | step 3 performed in an "metal etcher" *high selectivity to oxide without damage to metal pad 85 |
|  | 3' | 30 $SF_6$/90 CHF3/20$CF_4$/100AR/ 300Watts | steps 1, 2 and 3' performed in one etch tool *high selectivity to oxide without damage to metal pad 85 |

1st Etch Stage—Steps 1 and 2—Etch Through The IMD Layers

In the first etch stage, a fuse opening 92 is etched thorough (a) the fuse photoresist openings 90A in the plurality of inter metal dielectric layers 54 64 74 and (b) the insulating layer 44 and a pad opening 94 is the top passivation layer 84 exposing the metal pad 85. The etching of the fuse opening 92 preferably using gas mixture comprising $SF_6$, Ar, $CH_3$ and $CF_4$. In all the following etch recipes for all the etch steps, a preferred parameter range is within +/−10% of the target value. Other preferred parameter limits are also listed in the tables and text below.

TABLE

Preferred Etch Parameters For Etch Recipe - Stage 1 - Step 1

| RIE - Plasma etch | units | Low | tgt | hi |
|---|---|---|---|---|
| Etch gas - SF6 |  | 8 | 10 | 12 |
| etch gas - CHF3 | sccm | 50 | 60 | 70 |
| etch gas CF$_4$ | SCCM | 15 | 20 | 25 |
| Ar flow | sccm | 80 | 100 | 120 |
| power | watts | 1000 | 1100 | 1200 |

The second etch step has a high selectivity to poly but the uniformity is less than step 1. The 2nd etch step continues the IMD layer etch but is highly selective etch oxide, not polysilicon.

TABLE step 2- a RIE etch

| step 2 RIE - Plasma etch | units | Low | tgt | hi |
|---|---|---|---|---|
| Etch gas |  |  |  |  |
| etch gas-CHF3 | sccm | 80 | 90 | 100 |
| etch gas CF$_4$ | SCCM | 8 | 10 | 12 |
| Ar flow | sccm | 90 | 100 | 110 |
| power | watts | 1000 | 1100 | 1200 |

2nd Etch Stage—Step 3—Etch Through The Etch Stop Layer 40

Figure 3:
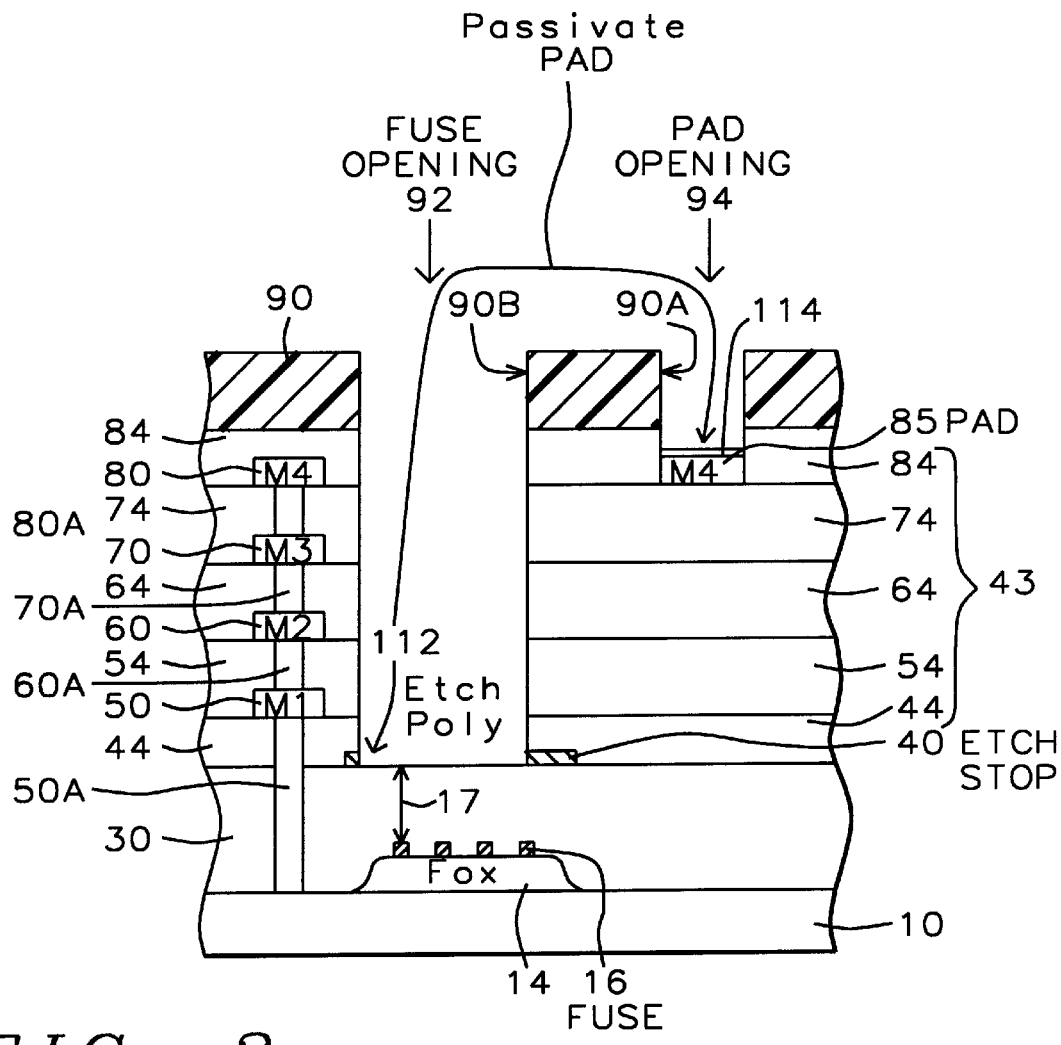

As shown in FIG. 3, the second etch stage (step 3 or 3') comprises etching though the etch stop layer 40 in the fuse opening 92 and forming a passivation layer 114 over the metal pad 85.

There are two preferred etch recipes for the third etch step: (a) step 3 (10 SF$_6$/0CHF3/0CF4/75Cl$_2$/100AR/300 Watts) or (b) step 3' (30 SF$_6$/90 CHF3/20CF4/100AR/300 Watts). Step 3 is preferably performed in a "metal" etcher that has Cl gas connections. Step 3' can be performed in the same "oxide" etcher that steps 1 and 2 were performed in. Please note that the type of etch depends on the gasses that are hooked up to the etch tool. If the appropriate gases are connected the steps 1, 2 and 3' could be run in the same tools. Therefore Steps 1, 2 and 3' have the advantage of being performed in one oxide etch tool. On the other hand etch steps 1, 2 and 3 are typically performed in 2 tools, (tool 1: oxide etcher performed steps 1 and 2, tool 2—metal etcher performs step 3).

The etch through the etch stop layer 40 is performed in the 3rd step using SF$_6$. The etch (step 3 or 3') through the etch stop layer 40 preferably removes less then 300 Å of the first dielectric layer 30. Preferably, the etch leave a thickness 17 of said first dielectric layer 30 over the fuse in a range of between about 2000 and 5000 Å.

TABLE

Preferred Process Parameters For Etch Step 3
(10 SF$_6$/75Cl$_2$/100Ar/300Watts)

| step 3 RIE- Plasma etch | units | Low | tgt | hi |
|---|---|---|---|---|
| Etch gas - SF$_6$ | sccm | 9 | 10 | 30 |
| AR flow | sccm | 90 | 100 | 110 |
| power |  | 1000 | 1100 | 1200 |

TABLE

Preferred Process Parameters For Etch Step 3' -
(30 SF$_6$/90 CHF3/20CF$_4$/100AR/300Watts)

| step 3 RIE plasma etch | units | Low | tgt | hi |
|---|---|---|---|---|
| Etch gas - SF$_6$ | sccm | 10 | 30 | 50 |
| etch gasses- CHF3 | sccm | 80 | 90 | 100 |
| etch gasses CF$_4$ | SCCM | 15 | 20 | 25 |
| AR flow | sccm | 90 | 100 | 110 |
| power | watts | 200 | 300 | 400 |

Please note that in all the above etch recipes for all the etch steps, a preferred parameter range is within +/−10% of the target value. Other preferred parameter limits are also listed in the tables and text above. It should be noted that the gas flow rates can be scaled by relative molar concentration to use in different size reactors using different flow rates and different conditions.

The second etch stage (112) (poly etch), etches through the etch stop layer 40 in the fuse opening and forming a passivation layer 114 over the metal pad. This passivation layer prevents damage to the metal pad 85. The passivation layer 114 is thought to be composed of a Al and F compound (AlF$_x$ a non-volatile product). It is thought that the SF$_6$ reacts with the Al alloy metal pad to form AlF$_x$. This passivation layer 114 is an important feature of the invention. Both steps 3 and 3' form the passivation layer 114.

The invention has the following benefits:

| Feature | Advantage |
|---|---|
| Polysilicon etch stop 40 formed from the second polysilicon layer (P2) 40A or the forth polysilicon layer (P4) 40B See FIG. 1B. | leaves a precise thickness 17 of first dielectric layer 30 is left over the fuses 16 after the etch - FIG. 1A. no etch damage to fuses. |
| Etch process - step 2 - using SF$_6$/CF$_3$/CF$_4$/Ar | high selectivity of oxide to polysilicon |

-continued

| Feature | Advantage |
|---|---|
| Etch process - step 3 or 3' with final etch stop etch using $SF_6$ | forms a passivation layer 104 over the metal pad 85 protecting the metal pad from etch defects |
| single photo step to form both fuse opening 92 and pad opening 94 See FIG. 1a. | less expensive process and less complex |

While the invention has been particularly shown and described with reference to the preferred embodiments thereof, it will be understood by those skilled in the art that various changes in form and details may be made without departing from the spirit and scope of the invention.

What is claimed is:

1. The method of forming a fuse opening using an etch stop layer comprising:
   (1a) forming isolation regions defining a fuse area and active areas on a substrate;
   (1b) forming fuses over said isolation regions over said fuse area;
   (1c) forming a first dielectric layer overlying said fuses;
   (1d) forming an etch stop layer over said first dielectric layer;
   (1e) forming an insulating layer over said etch stop layer;
   (1f) forming a first photoresist layer having fuse photoresist openings over said fuse area;
   (1g) forming a fuse opening in said insulating layer by etching, in a first etch stage, thorough said fuse photoresist openings and stopping the first etch stage on said etch stop layer;
   (1h) etching though said etch stop layer in said fuse opening in a second etch stage.

2. The method of claim 1 wherein said first dielectric layer has a thickness in a range of between about 1000 and 3000 Å.

3. The method of claim 1 wherein said etch stop layer is composed of a material selected from the group consisting of polysilicon and polycide; and said etch stop layer having a thickness in a range of between about 500 and 3000 Å.

4. The method of claim 1 wherein said etch stop layer is formed from a polysilicon layer that comprises a contact to said substrate in said active area.

5. The method of claim 1 wherein said etch stop layer is formed from a polysilicon layer that also forms a Top electrode of a capacitor over said active area.

6. The method of claim 1 wherein said insulating layer comprised of a plurality of inter metal dielectric layers composed of oxide and having a total thickness in a range of between about 6 and 7 μm.

7. The method of claim 1 wherein the etching of said fuse opening performed with a gas mixture comprised of $SF_6$, Ar, $CHF_3$ and $CF_4$.

8. The method of claim 1 wherein said first etch stage consists of two etch steps, a first etch step and a second etch step; said first etch step uses a gas mixture comprised of $SF_6$, Ar, $CHF_3$ and $CF_4$; and said second etch step uses a gas mixture consisting of Ar, $CHF_3$ and $CF_4$.

9. The method of claim 1 wherein step (1h) further includes forming a top passivation layer over a metal pad.

10. The method of claim 1 wherein step (1h) further includes etching through said etch stop layer in said second etch stage performed using gas mixture comprised of a F containing gas and a Chloride containing gas; and over etching into said first dielectric layer less than 300 Å.

11. The method of claim 1 wherein step (1h) further includes etching through said etch stop layer in said second etch stage performed using gas mixture comprised of a $SF_6$, $CHF_3$, $CF_4$, and Ar; and over etching into said first dielectric layer less than 300 Å.

12. The method of forming a fuse opening using an etch stop layer comprising:
   (12a) forming isolation regions defining a fuse area and active areas on a substrate;
   (12b) forming fuses over said isolation regions over said fuse area;
   (12c) forming a first dielectric layer overlying said fuses;
   (12d) forming an etch stop layer over said first dielectric layer;
   (12e) forming an insulating layer over said etch stop layer;
   (12f) forming a top metal layer and a metal pad over said insulating layer;
   (12g) forming a top passivation layer over said top metal layer and said insulating layer;
   (12h) forming a first photoresist layer having fuse photoresist openings over said fuse area, and having an photoresist pad opening over said metal pad;
   (12i) forming a fuse opening in said insulating layer by etching, in a first etch stage, thorough said fuse photoresist openings and stopping the first etch stage on said etch stop layer;
      (1) said first etch stage consists of a first etch step and a second etch step; said first etch step uses a gas mixture comprised of $SF_6$, Ar, $CHF_3$ and $CF_4$; and said second etch step uses a gas mixture consisting of Ar, $CHF_3$ and $CF_4$;
   (12j) etching though said etch stop layer in said fuse opening in a second etch stage.

13. The method of claim 12 wherein said etch stop layer is formed from a polysilicon layer that comprises a contact to said substrate in said active area.

14. The method of claim 12 wherein said etch stop layer is formed from a polysilicon layer that also forms a top electrode of a capacitor over said active area.

15. The method of claim 12 wherein step (12i) said first etch stage further includes etching said top passivation layer exposing said top metal pad, and
   wherein step (12j) said second etch stage further includes forming a passivation layer over said metal pad.

16. The method of claim 12 wherein step (12j) further includes etching through said etch stop layer in said second etch stage performed using gas mixture comprised of a F containing gas and a Chloride containing gas.

17. The method of claim 12 wherein step (12j) further includes etching through said etch stop layer in said second etch stage performed using gas mixture comprised of a $SF_6$, $CHF_3$, $CF_4$, and Ar; and over etching into said first dielectric layer less than 300 Å.

18. A method of forming a fuse opening using an etch stop layer and a pad opening and a specialized two stage etch process comprising:
   (18a) forming isolation regions defining a fuse area and active areas on a substrate;

(18b) forming fuses over said isolation regions over said fuse area;

(18c) forming a first dielectric layer overlying said fuses;

(18d) forming an etch stop layer over said first dielectric layer;

(18e) forming an first insulating layer over said etch stop layer;

(18f) forming a plurality of metal layers, spaced apart by a plurality of inter metal dielectric layers over said insulating layer; said plurality of metal layers having a top metal layer and a metal pad formed from said top metal layer;

(18g) forming a top passivation layer over said top metal layer and said insulating layer;

(18h) forming a first photoresist layer having fuse photoresist openings over said fuse area and a photoresist pad opening over said metal pad;

(18i) etching, in a first etch stage, a fuse opening thorough said fuse photoresist openings in said top passivation layer, said plurality of inter metal dielectric layers, and said insulating layer; and etching a pad opening in said top passivation layer exposing said metal pad;

(18j) etching, in a second etch stage, though said etch stop layer in said fuse opening and forming a passivation layer over said metal pad.

19. The method of claim 18 wherein said etch stop layer is composed of a material selected from the group consisting of polysilicon and polycide; and said etch stop layer having a thickness in a range of between about 500 and 3000 Å.

20. The method of claim 18 wherein said etch stop layer is formed from a polysilicon layer (p2) that comprises a contact to said substrate in said active area.

21. The method of claim 18 wherein said etch stop layer is formed from a polysilicon layer (p4) that also forms a Top electrode of a capacitor over said active area.

22. The method of claim 18 wherein said first etch stage consists of two etch steps, a first etch step and a second etch step; said first etch step uses a gas mixture comprised of $SF_6$, Ar, $CHF_3$ and $CF_4$; and said second etch step uses a gas mixture consisting of Ar, $CHF_3$ and $CF_4$.

23. The method of claim 18 wherein step (18i) further includes etching through said etch stop layer in said second etch stage performed using gas mixture comprised of a F containing gas and a Chloride containing gas.

24. The method of claim 18 wherein step (18j) further includes etching through said etch stop layer in said second etch stage performed using gas mixture comprised of a $SF_6$, $CHF_3$, $CF_4$, and Ar.

* * * * *